(12) United States Patent
Shin et al.

(10) Patent No.: US 8,760,934 B2
(45) Date of Patent: Jun. 24, 2014

(54) 3-D STRUCTURED NON-VOLATILE MEMORY DEVICE AND METHOD OF MANUFACTURING THE SAME

(75) Inventors: Hack Seob Shin, Gyeonggi-do (KR); Sang Hyun Oh, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 91 days.

(21) Appl. No.: 13/397,024

(22) Filed: Feb. 15, 2012

(65) Prior Publication Data
US 2012/0206979 A1   Aug. 16, 2012

(30) Foreign Application Priority Data

Feb. 16, 2011   (KR) .................. 10-2011-0013782

(51) Int. Cl.
*G11C 16/04* (2006.01)
(52) U.S. Cl.
USPC ..................... 365/185.26; 365/63; 365/51
(58) Field of Classification Search
USPC .......... 365/185.26, 195.18, 185.21–185, 23, 365/185.29, 63, 51; 257/324, E29.309, 257/E21.423
See application file for complete search history.

(56) References Cited

U.S. PATENT DOCUMENTS

| 5,625,590 | A  | * | 4/1997 | Choi et al. ............... 365/185.17 |
| 6,721,205 | B2 | * | 4/2004 | Kobayashi et al. ...... 365/185.26 |
| 8,541,832 | B2 | * | 9/2013 | Kim et al. ..................... 257/324 |

FOREIGN PATENT DOCUMENTS

KR   1020110001487   1/2011

OTHER PUBLICATIONS

Office Action issued by the Korean Intellectual Property Office on Aug. 22, 2012.

* cited by examiner

*Primary Examiner* — David Lam
(74) *Attorney, Agent, or Firm* — IP & T Group LLP

(57) ABSTRACT

A non-volatile memory device includes channel structures that each extend in a first direction, wherein the channel structures each include channel layers and interlayer dielectric layers that are alternately stacked; source structure extending in a second direction crossing the first direction and connected to ends of the channel structures, wherein the source structure includes source lines and interlayer dielectric layers that are alternately stacked; and word lines extending in the second direction and formed to surround the channel structures.

15 Claims, 17 Drawing Sheets

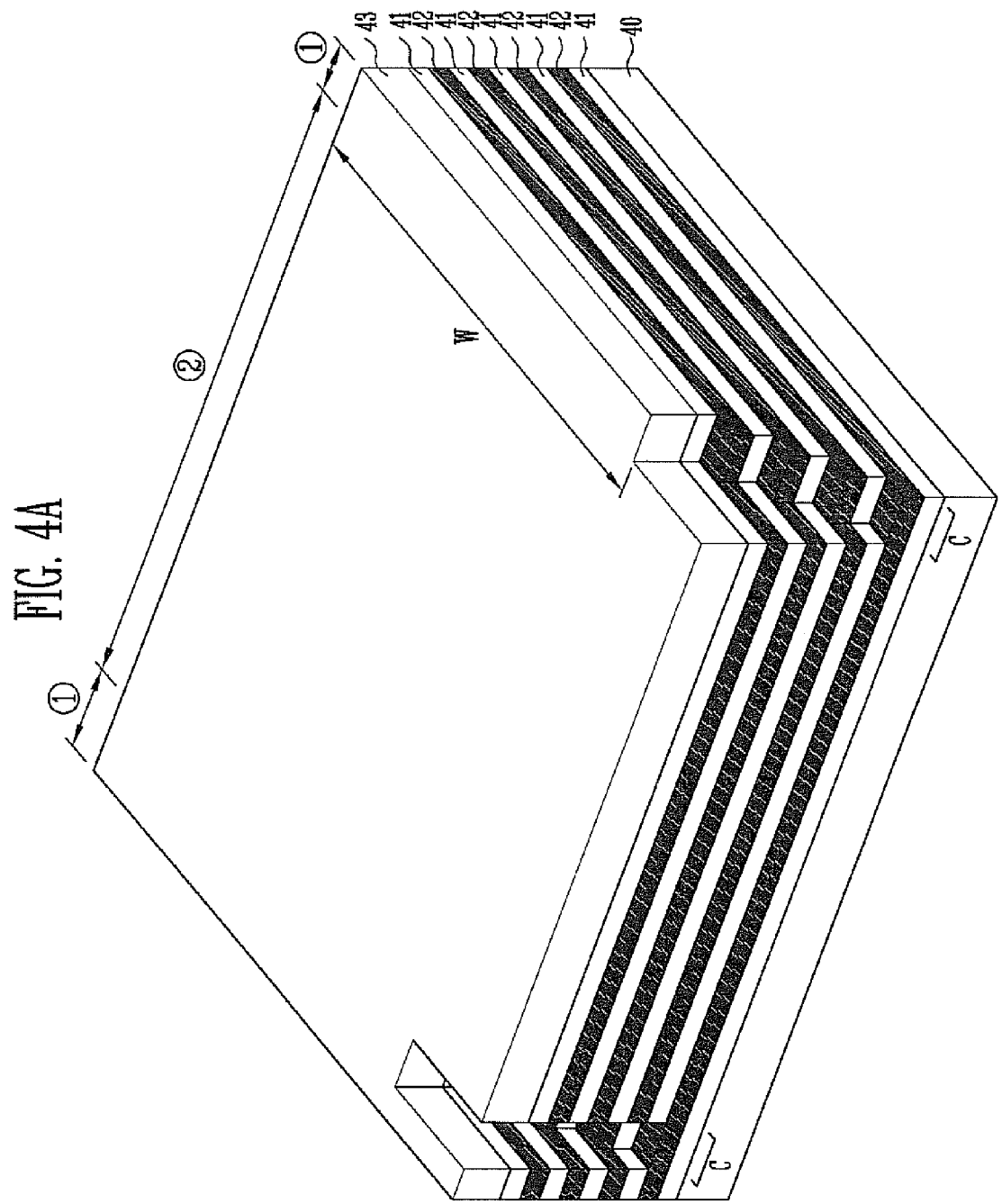

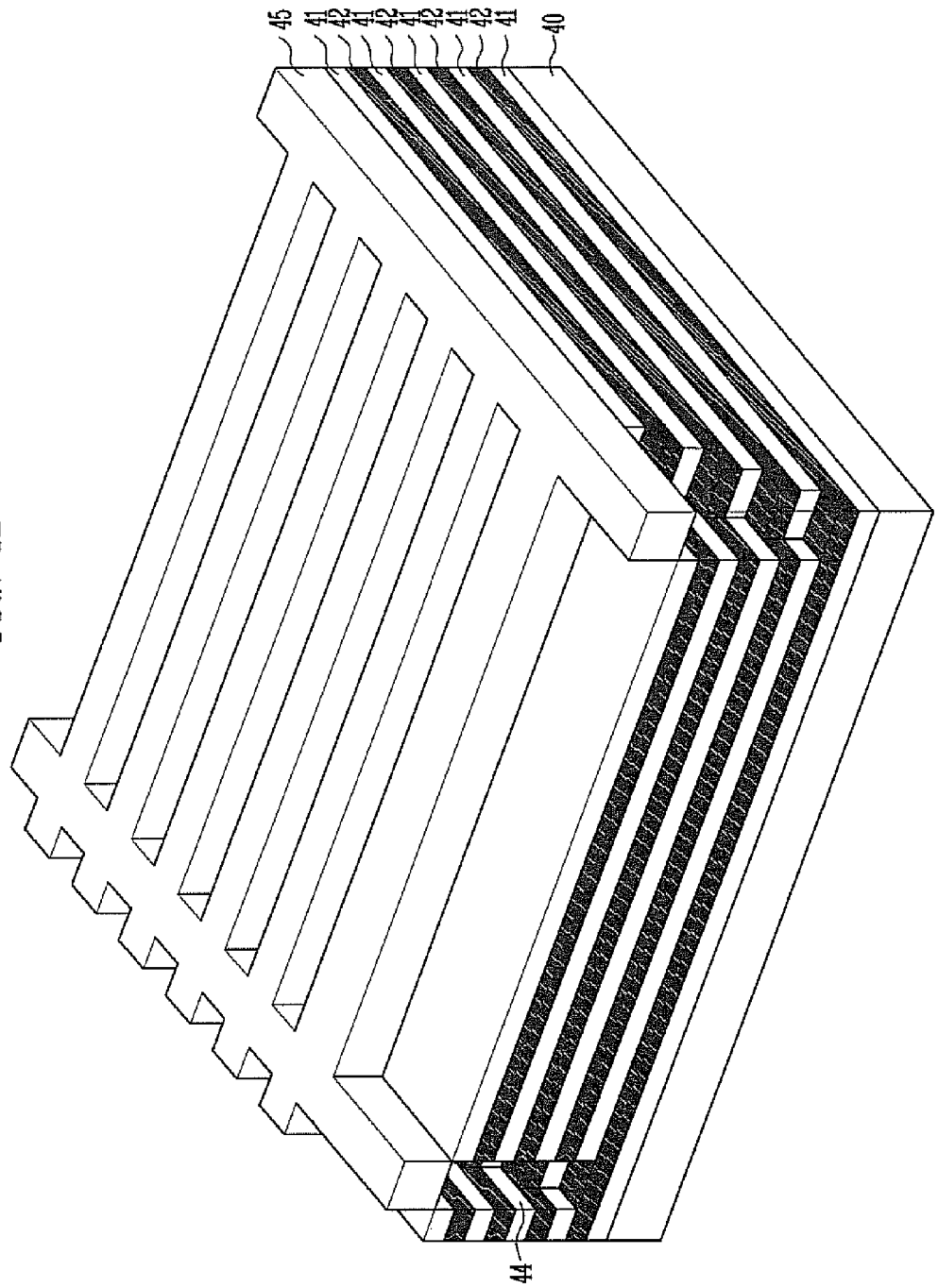

US 8,760,934 B2

3-D STRUCTURED NON-VOLATILE MEMORY DEVICE AND METHOD OF MANUFACTURING THE SAME

CROSS-REFERENCE TO RELATED APPLICATION

Priority to Korean patent application number 10-2011-0013782 filed on Feb. 16, 2011, the entire disclosure of which is incorporated by reference herein, is claimed.

BACKGROUND

Exemplary embodiments relate to a non-volatile memory device and a method of manufacturing the same and, more particularly, to a three dimensional (3-D) structured non-volatile memory device and a method of manufacturing the same.

A non-volatile memory device is a memory device that retains data although the supply of power is stopped. As an increase in the integration degree of 2-D structured memory devices fabricated in a single layer on a silicon substrate recently is reaching physical limits, a 3-D structured non-volatile memory device in which memory cells are vertically stacked from the silicon substrate is being developed.

The structure and features of the 3-D structured non-volatile memory device are described below with reference to FIG. 1.

FIG. 1 is a cross-sectional view of a known 3-D structured non-volatile memory device.

As shown in FIG. 1, the known vertical channel type non-volatile memory device includes a lower select transistor LST, a plurality of memory cells MC, and an upper select transistor UST which are stacked along channels CH protruded from a substrate 10 including a source region S. Here, the plurality of memory cells MC is coupled in series between the lower select transistor LST and the upper select transistor UST to form one string STRING, and each string is coupled to a bit line BL. In this structure, the integration degree of the memory devices may increase because the strings are vertically arranged from the substrate 10 as compared with a known flat plate type (2-D) memory device.

The lower select transistor LST includes a channel CH, a gate insulating layer 13 surrounding the channel CH, and a lower select line 12. The upper select transistor UST includes a channel CH, gate insulating layers 13 and 19 surrounding the channel CH, and an upper select line 18. Reference numerals '11 and 17' denote interlayer dielectric layers.

The plurality of memory cells MC include a channel CH, a tunnel insulating layer surrounding the channel CH, a charge trap layer, a charge block layer 16, and word lines 15. Reference numeral '14' denotes an interlayer dielectric layer.

In this structure, after the word lines 15 are formed, the charge block layer, the charge trap layer, and the tunnel insulating layer 16 are sequentially formed and the channels CH are formed. Here, the manufacturing process is different from the process of manufacturing the flat plate type non-volatile memory device. Accordingly, the film quality of the tunnel insulating layer already formed may deteriorate in the process of forming the channels CH, and thus characteristics of the memory device may deteriorate.

BRIEF SUMMARY

Exemplary embodiments relate to a 3-D structured non-volatile memory device fabricated according to the same sequence as the known flat plate type non-volatile memory device and a method of manufacturing the same.

A non-volatile memory device according to an aspect of the present disclosure includes channel structures that each extend in a first direction, wherein the channel structures each include channel layers and interlayer dielectric layers that are alternately stacked; source structure extending in a second direction crossing the first direction and connected to ends of the channel structures, wherein the source structure includes source lines and interlayer dielectric layers that are alternately stacked; and word lines extended to the second direction and formed to surround the channel structure.

A non-volatile memory device according to another aspect of the present disclosure includes channel structures each formed to include channel layers and interlayer dielectric layers which are alternately stacked; source lines coupled to the respective channel layers included in the channel structures; and bit lines coupled to the channel layers included in each of the channel structures.

A non-volatile memory device according to yet another aspect of the present disclosure includes channel structures extending in a first direction, wherein the channel structures each include channel layers and interlayer dielectric layers that are alternately stacked; source structure extending in a second direction crossing the first direction, connected to ends of the channel structures, and including source lines and interlayer dielectric layers that are alternately stacked; word lines extending in the second direction and formed to surround the channel structures; drain select line formed on one side of the word lines, formed to surround the channel structures, and extending in the second direction; source select lines formed on the other side of the word lines, wherein the source select lines are formed in the channel structures, respectively; and bit lines extending in the first direction and coupled to the channel layers and source select lines of the channel structures.

A method of manufacturing a non-volatile memory device according to further yet another aspect of the present disclosure includes alternately forming semiconductor layers and interlayer dielectric layers; forming channel structures extending in a first direction, and a source structure connected to ends of the channel structures and extending in a second direction crossing the first direction, by etching the semiconductor layers and the interlayer dielectric layers; forming a tunnel insulating layer, a charge trap layer, and a charge block layer over an entire structure including the channel structures and the source structure; forming a first conductive layer on an entire structure including the tunnel insulating layer, the charge trap layer, and the charge block layer; and forming word lines to surround the channel structures and to extend in the second direction, by etching the first conductive layer, the tunnel insulating layer, the charge trap layer, and the charge block layer.

BRIEF DESCRIPTION OF THE DRAWINGS

FIGS. 4A to 4J are perspective views illustrating a method of manufacturing the 3-D structured non-volatile memory device according to the second embodiment of this disclosure;

DESCRIPTION OF EMBODIMENTS

Hereinafter, some exemplary embodiments of the present disclosure will be described in detail with reference to the accompanying drawings. The figures are provided to enable those of ordinary skill in the art to make and use the present invention according to exemplary embodiments of the present invention.

Figure 1:
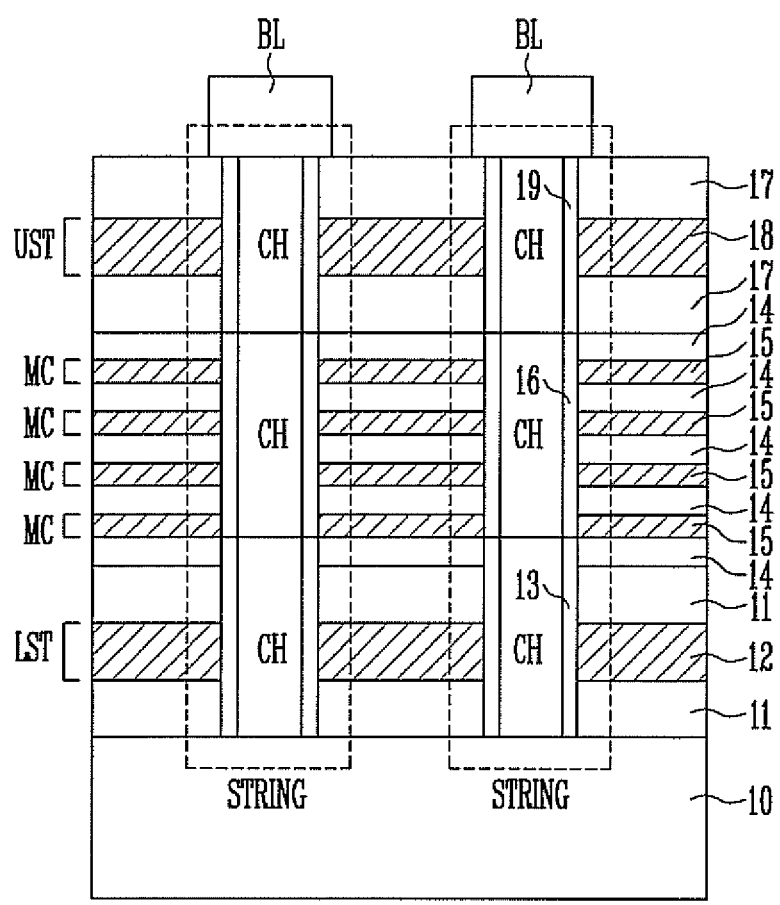
FIG. 1 is a cross-sectional view of a known 3-D structured non-volatile memory device.
Figure 2A:
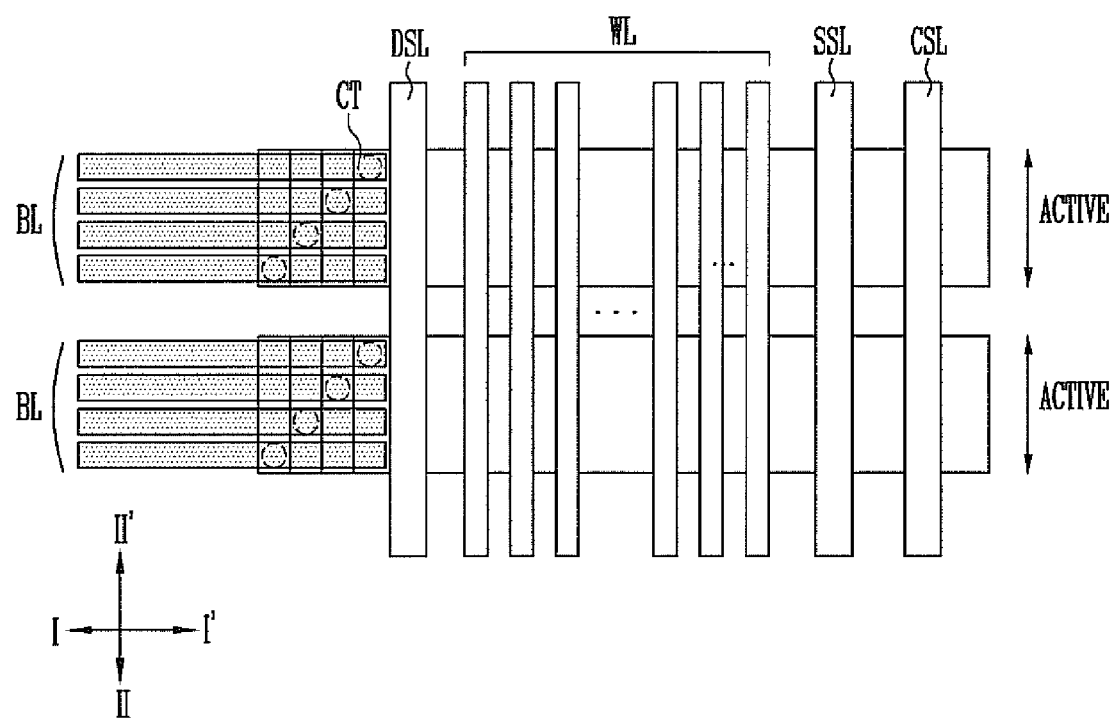
FIG. 2A is a layout diagram of a 3-D structured non-volatile memory device according to a first embodiment of this disclosure.

FIG. 2A is a layout diagram of a 3-D structured non-volatile memory device according to a first embodiment of this disclosure.

As shown in FIG. 2A, the 3-D structured non-volatile memory device according to the first embodiment of this disclosure includes a plurality of active regions ACTIVE extended in a first direction I-I'. A plurality of channel layers are stacked in each of the active regions ACTIVE.

The 3-D structured non-volatile memory device further includes a drain select line DSL, a plurality of word lines WL, a source select line SSL, and a common source line CSL which are each arranged in a second direction II-II' crossing the first direction I-I'.

The 3-D structured non-volatile memory device further includes a plurality of bit lines BL coupled to respective channel layers stacked over in each of the active regions ACTIVE and each extended in the first direction I-I'. The bit lines BL are coupled to the respective channel layers through the respective contact plugs CT.

Figure 2B:
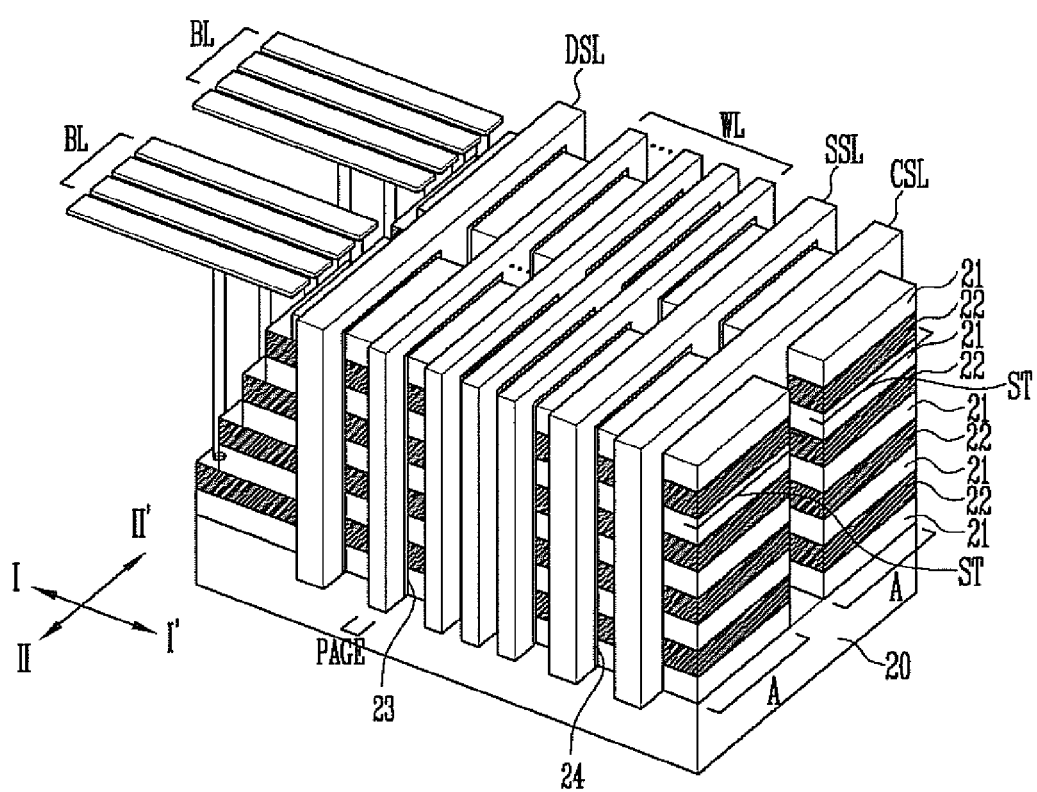
FIG. 2B is a perspective view showing the structure of the 3-D structured non-volatile memory device according to the first embodiment of this disclosure.

FIG. 2B is a perspective view showing the structure of the 3-D structured non-volatile memory device according to the first embodiment of this disclosure.

As shown in FIG. 2B, the 3-D structured non-volatile memory device according to the first embodiment of this disclosure includes a plurality of channel structures A extended in a first direction I-I'. Each of the channel structures A includes a plurality of interlayer dielectric layers 21 and a plurality of channel layers 22 which are alternately stacked over a substrate 20. Accordingly, a plurality of strings ST are arranged in parallel to the substrate 20 and stacked over the substrate 20 as the channel structures A. Furthermore, memory cells sharing a word line WL form one page PAGE.

The 3-D structured non-volatile memory device further includes a plurality of word lines WL configured to surround the plurality of channel structures A (that is, along the sidewalls of the channel structures A) and extended in a second direction II-II' crossing the first direction I-I'. A tunnel insulating layer, a charge trap layer, and a charge block layer 23 are interposed between the word lines WL and the channel structures A. Accordingly, the plurality of memory cells is stacked along the sidewalls of the channel structures A and arranged in the first direction I-I' and the second direction II-II'.

A drain select line DSL is disposed on one side of the plurality of word lines WL, and a source select line SSL and a common source line CSL are disposed on the other side of the plurality of word lines WL. A gate insulating layer 24 is provided between the drain select line DSL and the channel structures A and between the source select line SSL and the channel structures A.

Here, the ends of the channel structures A on one side are patterned stepwise in order to expose the channel layers 22. The channel layers 22 are coupled to the respective bit lines BL through contact plugs CT (CT1-CT3 in FIG. 3A).

A manufacturing process according to the first embodiment is performed so that the deterioration of characteristics of the memory device due to damage to a tunnel insulating layer, etc. can be prevented. Here, the area for forming the contact plug CT is prepared in each the channel structure A in order to couple the plurality of channel layers 22 stacked over the substrate 20 to the respective bit lines BL.

Table 1 shows operating conditions of the 3-D structured non-volatile memory device according to the first embodiment of this disclosure.

TABLE 1

|  | BL | CSL | DSL | SSL | WL |
| --- | --- | --- | --- | --- | --- |
| PGM array | Vcc | Vcc | Vcc | 0 V | Vpass |
| NO-PGM array | floating | Vers | floating | floating | 0 V |
| Erase | 1 V | 0 V | Vcc | Vcc | Vread |
| READ array | 0 V | 0 V | 0 V | 0 V | Vread |
| NO-READ array | Vcc | Vcc | Vcc | 0 V | Von |

In a program operation, the operating voltage Vcc is applied to the common source line CSL and the drain select line DSL, and the source select line SSL is grounded. Here, the bit lines BL coupled to the strings ST including memory cells to be programmed are grounded, and the operating voltage Vcc is applied to the remaining bit lines BL coupled to the remaining strings ST. Furthermore, the program voltage Vpgm is applied to the word line WL coupled to the page PAGE to be programmed, and the pass voltage Vpass is applied to the remaining word lines WL. In this state, the program operation is performed on the selected page PAGE.

In an erase operation, the bit lines BL, the drain select line DSL, and the source select line SSL are floated, and the erase voltage Vers is applied to the common source line CSL. In this state, the erase operation is performed on a selected memory block MB.

In a read operation, the common source line CSL is grounded. 1 V is applied to the bit lines BL coupled to the strings ST including memory cells to be read and the operating voltage Vcc is applied to the drain select line DSL and to the source select line SSL. The remaining bit lines BL coupled to the remaining strings ST not including the memory cells to be read, the drain select line DSL, and the source select line SSL are grounded. Furthermore, the read voltage Vread is applied to the word line WL coupled to the page PAGE to be read, and the turn-on voltage Von is applied to the remaining word lines WL. Here, the read voltage Vread is voltage that turns on or off memory cells according to whether the memory cells have been programmed, and the turn-on voltage Von is voltage that turns on the memory cells irrespective of whether the memory cells have been programmed.

Figure 3A:
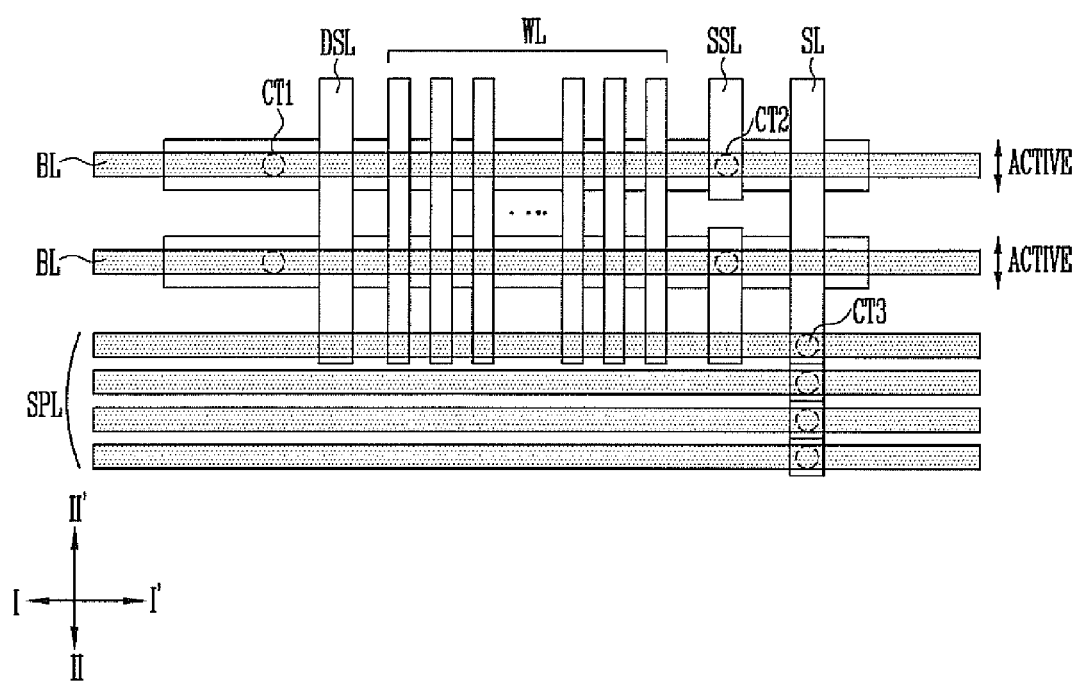
FIG. 3A is a layout diagram of a 3-D structured non-volatile memory device according to a second embodiment of this disclosure.

FIG. 3A is a layout diagram of a 3-D structured non-volatile memory device according to a second embodiment of this disclosure.

As shown in FIG. 3A, the 3-D structured non-volatile memory device according to the second embodiment includes a plurality of active regions ACTIVE extended in a first direction I-I'. A plurality of channel layers is stacked in each of the active regions ACTIVE.

The 3-D structured non-volatile memory device further includes a drain select line DSL, a plurality of word lines WL, a plurality of source select lines SSL, and a source line SL which are arranged in a second direction II-II' crossing the first direction I-I'. Here, the source select line SSL is formed in each active region ACTIVE. The source line SL has a stack structure of plural source lines SL, and it is coupled the plurality of channel layers formed in the active regions ACTIVE.

Furthermore, one bit line BL is coupled to each active region ACTIVE. The bit line BL is extended in the first direction I-I' and coupled to a drain contact plug CT1 and a source contact plug CT2.

Figure 3B:
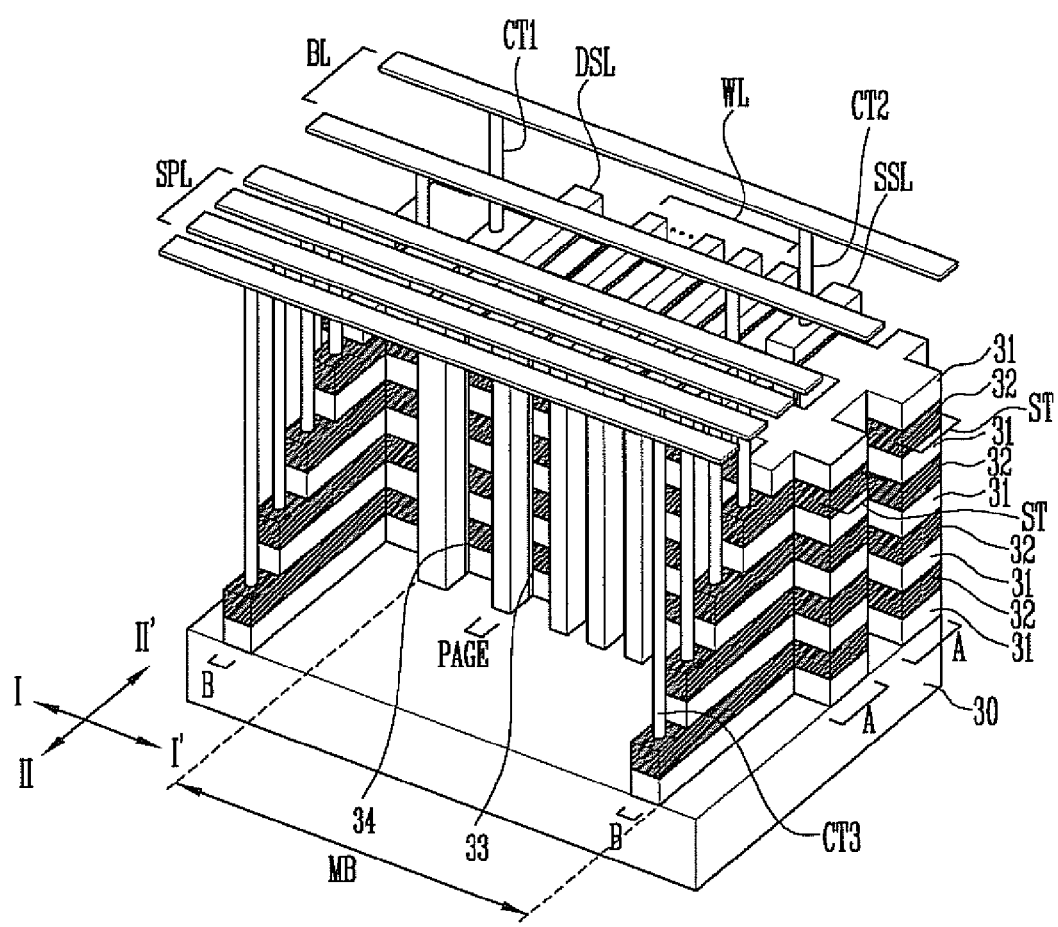
FIG. 3B is a perspective view showing the structure of the 3-D structured non-volatile memory device according to the second embodiment of this disclosure.

FIG. 3B is a perspective view showing the structure of the 3-D structured non-volatile memory device according to the second embodiment of this disclosure.

As shown in FIG. 3B, the 3-D structured non-volatile memory device according to the second embodiment includes a plurality of channel structures A extended in parallel in a first direction I-I' and a plurality of source structures B connected to ends of the channel structures A on one side and extended in a second direction II'-II' crossing the first direction I-I'.

Each of the channel structures A includes a plurality of interlayer dielectric layers 31 and a plurality of channel layers which are alternately stacked over a substrate 30. Accordingly, a plurality of strings ST is arranged in parallel to the substrate 30 and thus stacked over the substrate 30 as the channel structure A. Furthermore, memory cells sharing a word line WL form one page PAGE.

Each of the source structures B includes a plurality of interlayer dielectric layers 31 and a plurality of source lines 32 which are alternately stacked over the substrate 30. Each string ST includes a source line 32. The source structure B adjoins the ends of the plurality of channel structures A forming one memory block MB on one side. Each memory block MB includes the plurality of channel structures A and a source structure B. Furthermore, the source line 32 formed in each layer is coupled to the channel layer 32 formed in the same layer among the plurality of channel layers 32. Here, the channel layer 32 and the source line 32 are assigned the same reference numeral and may be formed of the same layer. The channel layer 32 and the source line 32 are differently named according to their different functions.

The 3-D structured non-volatile memory device further includes a plurality of word lines WL formed to surround the plurality of channel structures A (that is, along the entire surface including the sidewalls of the channel structures A) and extended in a second direction II'-II' crossing the first direction I-I'. A tunnel insulating layer, a charge trap layer, and a charge block layer 33 are disposed between the word lines WL and the channel structures A. Accordingly, the plurality of memory cells is stacked along the sidewalls of the channel structures A and arranged in the first direction I-I' and the second direction II-II'.

A drain select line DSL is disposed on one side of the plurality of word lines WL, and a plurality of source select lines SSL is disposed on the other side of the plurality of word lines WL. Here, the drain select line DSL is coupled to the plurality of channel structures A and extended in the second direction. The source select line SSL is formed in each channel structure A. A gate insulating layer 34 is provided between the drain select line DSL and the channel structures A and between the source select lines SSL and the channel structures A.

The 3-D structured non-volatile memory device further includes a plurality of bit lines BL coupled to the respective channel structures A. That is, one bit line BL is included in each channel structure A. The bit line BL is coupled to the plurality of channel layers 32 of a channel structure A, through a drain contact plug CT1 and also coupled to the source select line SSL, formed over the one channel structure A, through a source contact plug CT2. Here, exemplary ones of the plurality of bit lines BL are shown in FIG. 3B for illustration purposes.

The ends of the source structures B on one side are patterned stepwise in order to expose the plurality of source lines 32. Each source line 32 is coupled to a source pickup line SPL through a source pickup plugs CT3. Here, the source lines 32 are coupled to the respective source pickup lines SPL for every layer.

According to the second embodiment, the source line 32 can be provided in each string through the source structure B in which the plurality of source lines 32 is stacked. Thus, it is not necessary to separately include the bit line BL in each of the channel layers 32 included in the channel structure A. In case of the first embodiment, the contact area for coupling the bit lines BL to the respective channel layers 22 in each channel structure A is formed. In case of the second embodiment, however, the contact area is optional. Although the pickup area for picking up the source line is formed in the second embodiment, the pickup area of the source line is also formed even in the first embodiment. Accordingly, the area of the memory device according to the second embodiment can be reduced as compared with the first embodiment.

Table 2 shows operating conditions of the 3-D structured non-volatile memory device according to the second embodiment.

TABLE 2

| | Read operation | | | Program Operation | | | Erase |
| --- | --- | --- | --- | --- | --- | --- | --- |
| | Channel structure selected | | Channel | Channel structure selected | | Channel | operation Memory |
| | String selected | String unselected | structure unselected | String selected | String unselected | structure unselected | block selected |
| BL | Vcc | Vcc | 0 V | Vcc | Vcc | 0 V | floating |
| DSL | | Vcc | | | 0 V | | floating |
| WL | | Vread | | | Vpgm/Vpass | | 0 V |
| SSL | Vcc | Vcc | 0 V | Vcc | Vcc | 0 V | floating |
| SL | 0 V | Vcc | 0 V/Vcc | 0 V | Vcc | 0 V/Vcc | Verase |

The 3-D structured non-volatile memory device according to the second embodiment performs a program operation and a read operation on a page basis and performs an erase operation for every memory block. Accordingly, in order to distinguish the strings stacked and the strings neighboring left and right from each other, the program, erase, and read operations are performed on the selected string and the unselected strings of a selected channel structure A and an unselected channel structure A under different conditions.

In the read operation, the read voltage Vread is applied to the word line WL, and the operating voltage Vcc is applied to the drain select line DSL. The operating voltage Vcc is applied to the bit line BL coupled to the selected channel structure A and the source select line SSL. Here, the source line SL of the selected string, from among the plurality of strings included in the selected channel structure A, is grounded, and the operating voltage Vcc is applied to the source line SL of the unselected strings.

In relation to the unselected channel structure A, the bit lines BL and the source select line SSL are grounded. Here, the source line SL is grounded on a layer basis or applied with the operating voltage Vcc.

In the program operation, the drain select line DSL is grounded, the program voltage Vpgm is applied to the word line WL including a page to be programmed, and the pass voltage Vpass is applied to the remaining word lines WL. The operating voltage Vcc is applied to the bit lines BL, coupled to a selected channel structure A, and the source select line SSL. Here, the source line SL of a selected string, from among the plurality of strings included in the selected channel structure A, is grounded, and the operating voltage Vcc is applied to the source line SL of the unselected strings.

In relation to an unselected channel structure A, the bit lines BL and the source select line SSL are grounded. Here, the source line SL is ground on a layer basis or applied with the operating voltage Vcc.

In the erase operation, the bit lines BL, the drain select line DSL, and the source select line SSL of a selected memory block are floated, the word lines WL are grounded, and the erase voltage Verase is applied to the source line SL.

FIGS. 4A to 4J are perspective views illustrating a method of manufacturing the 3-D structured non-volatile memory device according to the second embodiment of this disclosure.

As shown in FIG. 4A, a plurality of interlayer dielectric layers 41 and a plurality of semiconductor layers 42 are alternately formed over a substrate 40. Here, the semiconductor layer 42 is used for a channel layer and a source line. The semiconductor layer 42 may be, for example, a polysilicon layer. In addition, conductive layer may be used instead of the semiconductor layer 42. The conductive layer may be, for example, a tungsten layer. The interlayer dielectric layer 41 is used to separate stacked memory cells from each other. The interlayer dielectric layer 41 may be, for example, an oxide layer. Although not shown, a hard mask layer may be further formed on the highest interlayer dielectric layer 41.

A first mask pattern 43 for forming source blocks C is formed over the plurality of interlayer dielectric layers 41 and the plurality of semiconductor layers 42. The first mask pattern includes first regions, covering part of source regions ①  where the source blocks C will be formed, and a second region fully covering a memory cell region ② where memory cells will be formed.

The source blocks C are formed by etching the plurality of interlayer dielectric layers 41 and the plurality of semiconductor layers 42 by using the first mask pattern 43 as an etch barrier. According to an example, the ends of the source blocks C on one side are patterned stepwise to expose the plurality of source lines 42. For example, the source blocks C having the ends on one side patterned stepwise may be formed by repeating performing an etch process while sequentially exposing pickup regions by reducing the width W of the first region in the state where the second region of the first mask pattern 43 remains intact.

When the etch process is repeated, the pickup regions having respective reduced widths are formed in the semiconductor layers 42, respectively. FIG. 4A shows a state where the plurality of pickup regions is formed by the repeated etch processes. In FIG. 4A, while the etch processes are shown to have been performed until the lowest semiconductor layer 42 is exposed, the etch processes may be performed until the lowest interlayer dielectric layer 41 or a surface of the substrate 40 is exposed.

As shown in FIG. 4B, a first sacrificial layer 44 is formed on the entire structure where the source blocks C are formed. A polishing process is performed until the highest interlayer dielectric layer 41 is exposed. The first sacrificial layer 44 is shown to be transparent, for illustration purposes.

A second mask pattern 45 for forming channel structures is formed on the resulting structure where the first sacrificial layers 44 are formed. Here, the second mask pattern 45 includes a first region, fully covering the source regions ①, and second regions, formed in the memory cell region ② and formed of a plurality of line patterns extended in a first direction I-I'. Here, the channel structures are formed in regions covered by the second regions of the second mask pattern 45.

Figure 4C:
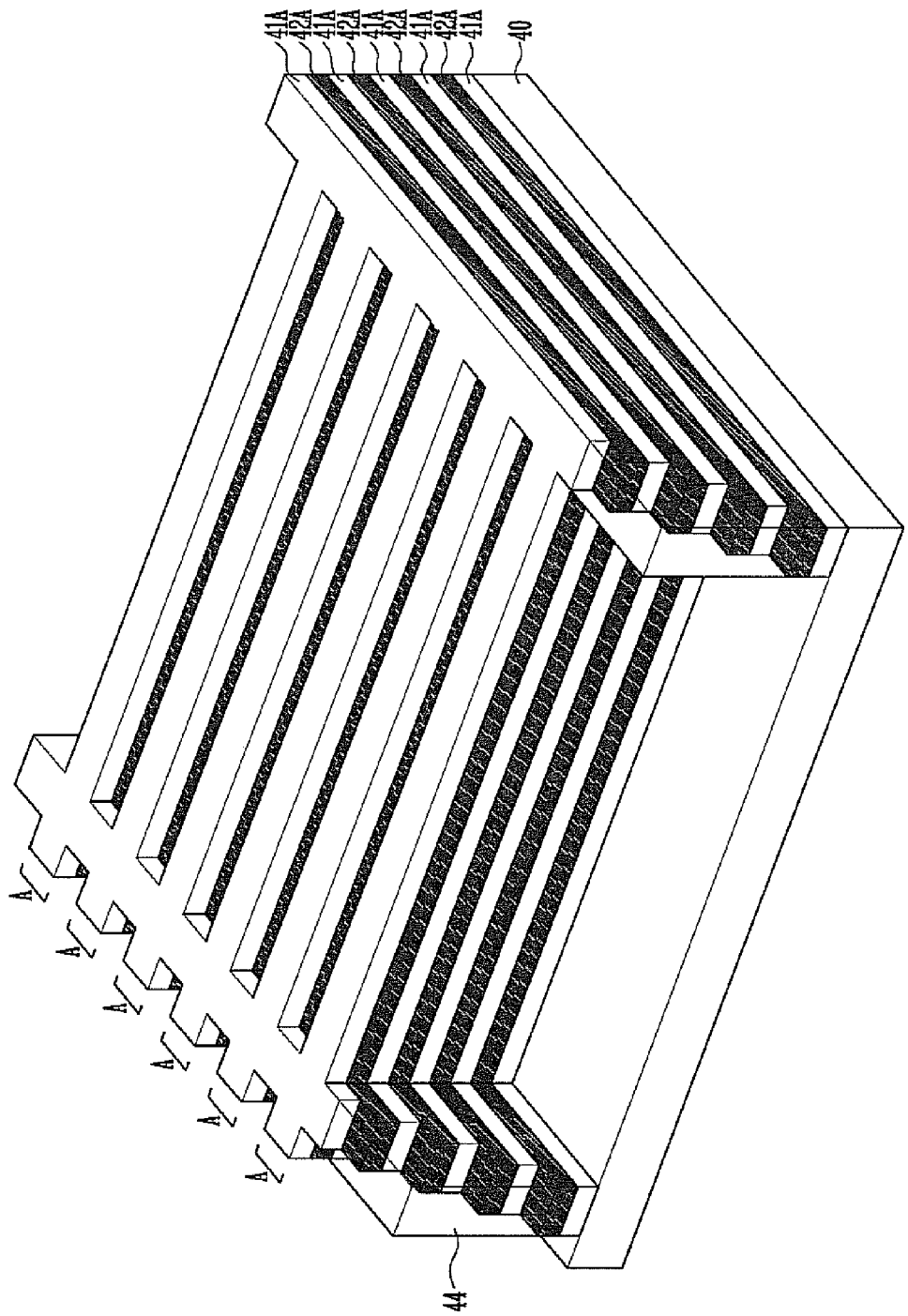

As shown in FIG. 4C, the plurality of interlayer dielectric layers 41 and the plurality of semiconductor layers 42 are etched by using the second mask pattern 45 as an etch barrier. Accordingly, the plurality of channel structures A, each including a plurality of interlayer dielectric layers 41A and a plurality of channel layers 42A alternately stacked, is formed. The channel structures A are extended in the first direction I-I'. Here, the semiconductor layers 42 included in the channel structures A are renamed the channel layers 42A because they function as channel layers.

Here, since both ends of the plurality of channel structures A are formed to adjoin the source blocks C, the same etch process as a process of forming line type trenches is performed. Accordingly, a gap region is provided between the adjacent channel structures A.

Figure 4D:
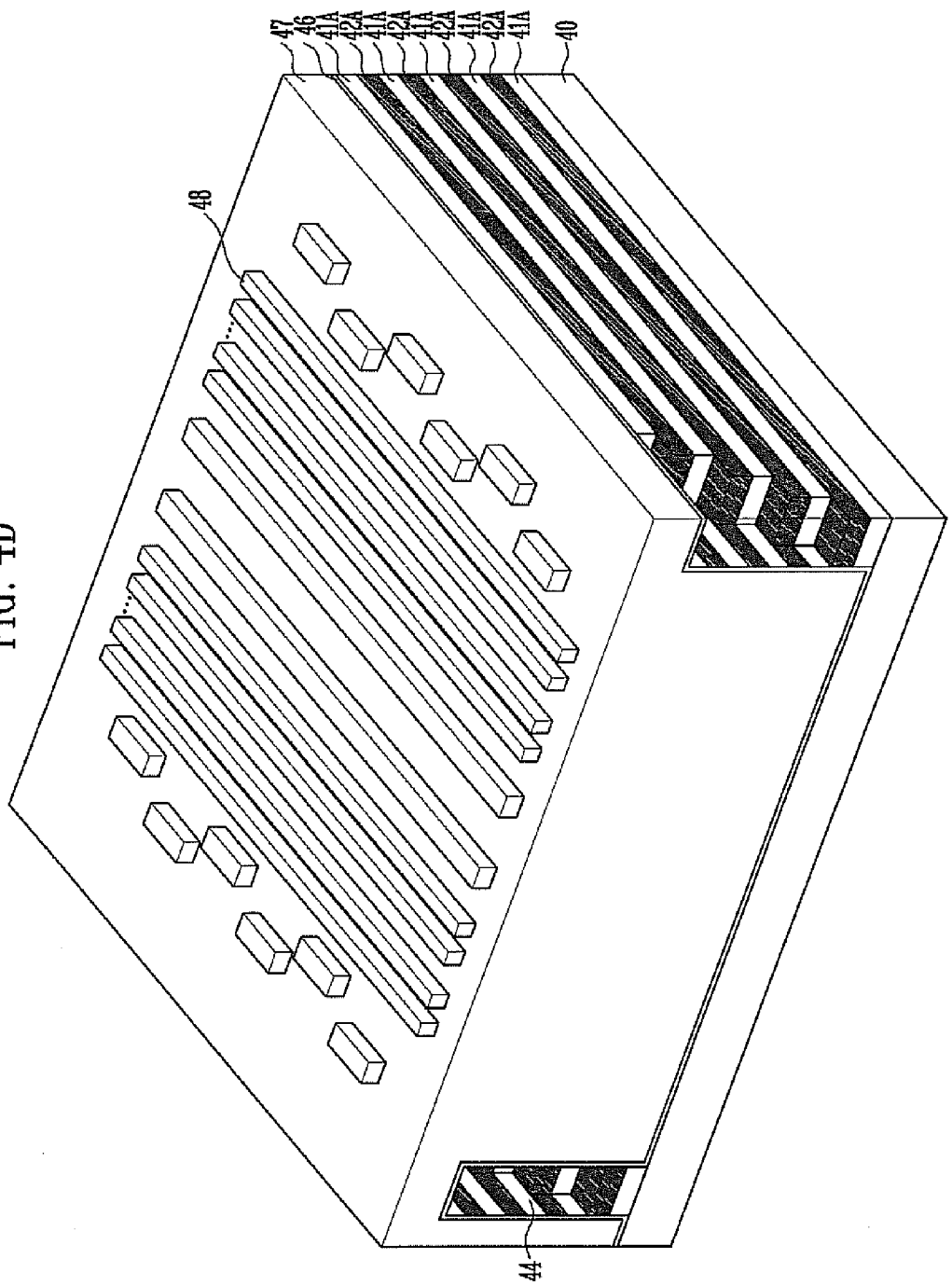

As shown in FIG. 4D, a tunnel insulating layer, a charge trap layer, and a charge block layer 46 are formed on the entire structure in which the plurality of channel structures A is formed. A first conductive layer 47 is formed on the entire structure in which the tunnel insulating layer, the charge trap layer, and the charge block layer 46 are formed. The first conductive layer 47 is used to form word lines WL, drain select lines DSL, and source select lines SSL and may be, for example, a polysilicon layer. Third mask patterns 48 for forming the word lines, the drain select line, and the source select lines are formed on the first conductive layer 47. The first conductive layer 47, the tunnel insulating layer, the charge trap layer, and the charge block layer 46 are etched by using the third mask patterns 48 as an etch barrier.

Figure 4E:
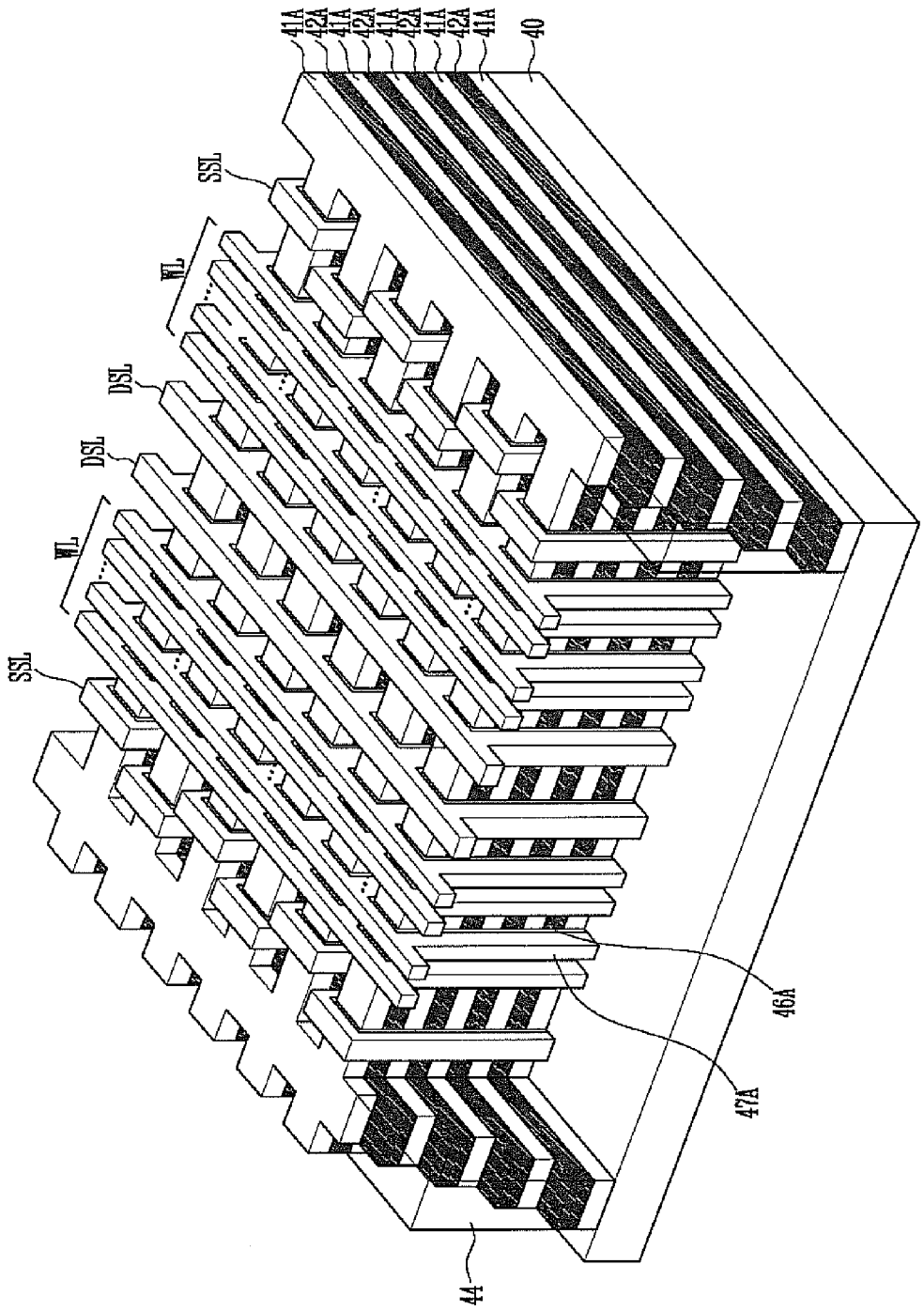

Accordingly, the word lines WL, the drain select lines DSL, and the source select lines SSL extended in the second direction II-II' are formed, as shown in FIG. 4E.

As described above with reference to FIG. 4A, if the hard mask layer is formed on the highest interlayer dielectric layer 41A, the word lines WL, the drain select lines DSL, and the source select lines SSL may be easily formed by etching the first conductive layer 47 by using the hard mask layer as an etch stop layer.

The word lines WL and the drain select lines DSL are extended in the second direction II-II' and formed to surround the plurality of channel structures A (that is, along the entire surface including the sidewalls of the channel structures). Accordingly, the plurality of channel structures A forming one memory block share the word lines WL and the drain select lines DSL.

The source select lines SSL are formed to surround the plurality of channel structures A (that is, along the sidewalls of the channel structures A). That is, the source select lines SSL are formed to each channel structure A. It is preferred that the source select lines SSL of the adjacent channel structures A be arranged in a staggered form. If the adjacent source select lines SSL are arranged in a staggered form as described above, an interval between the channel structures A becomes smaller and thus the degree of integration of the memory devices can be further improved.

The tunnel insulating layer, the charge trap layer, and the charge block layer 46A interposed between the drain select line DSL and the channel structure A and between the source select line SSL and the channel structure A function as gate insulating layers.

Figure 4F:
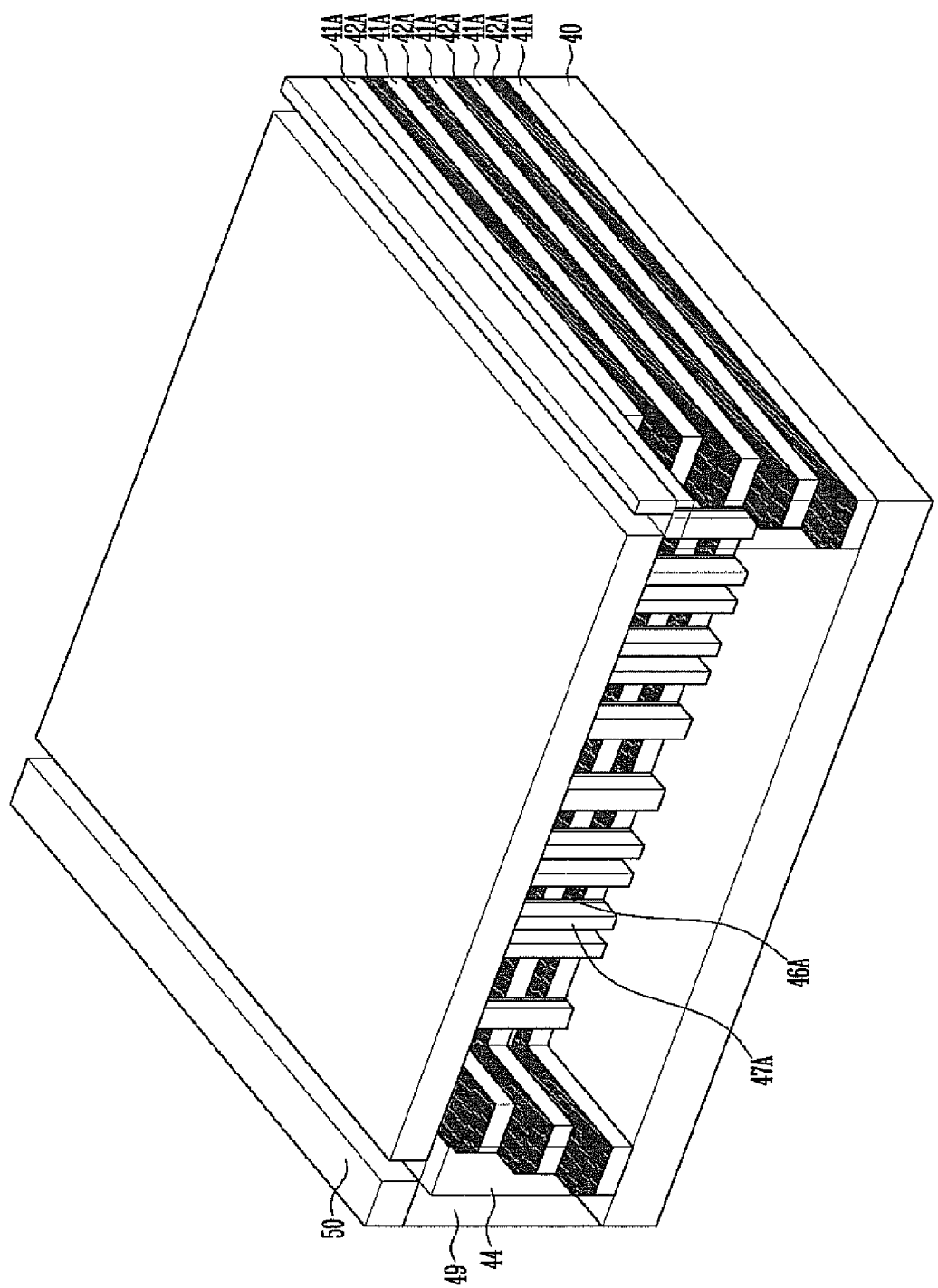

As shown in FIG. 4F, a second sacrificial layer 49 is formed on the surface in which the word lines WL, the drain select lines DSL, and the source select lines SSL are formed, and a polishing process is subsequently performed. The polishing process may be performed until the surface of the word lines WL, the drain select lines DSL, and the source select lines SSL is exposed or may be performed so that the second sacrificial layer 49 of a desired thickness remains on the surface of the word lines WL, the drain select lines DSL, and the source select lines SSL.

A fourth mask pattern 50 for forming source structures is formed on the surface where the second sacrificial layer 49 is formed. The fourth mask pattern 50 includes the first region, exposing the central region of the source regions ①, but covering the edge regions thereof, and the second region fully covering the memory cell region ②.

Figure 4G:
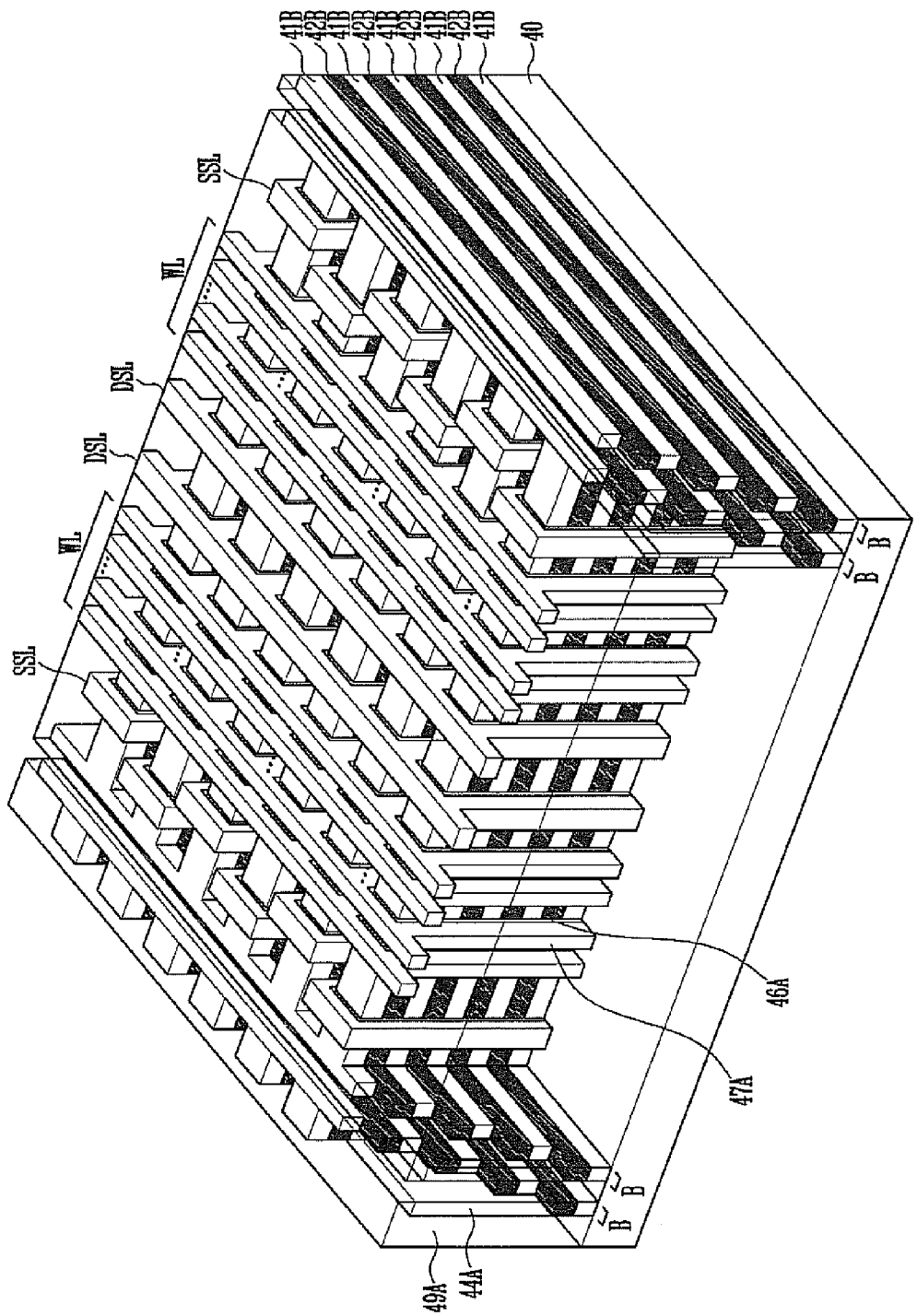

As shown in FIG. 4G, the second sacrificial layer 49, the first sacrificial layer 44, the plurality of interlayer dielectric layers 41A, and the plurality of semiconductor layers 42A are etched by using the fourth mask pattern 50 as an etch barrier. Accordingly, the plurality of source structure B, including a plurality of interlayer dielectric layers 41B and a plurality of source lines 42B, is formed. The plurality of interlayer dielectric layers 41B and the plurality of source lines 42B are extended in the second direction II-II and alternately stacked over the substrate 40. Here, the plurality of semiconductor layers 42B included in the source structures B functions as the source lines, and thus they are renamed as 'source lines 42B'. Furthermore, in FIG. 4G, the etched first sacrificial layer is newly labeled as 44A and the etched second sacrificial layer is newly labeled as 49A.

Figure 4H:
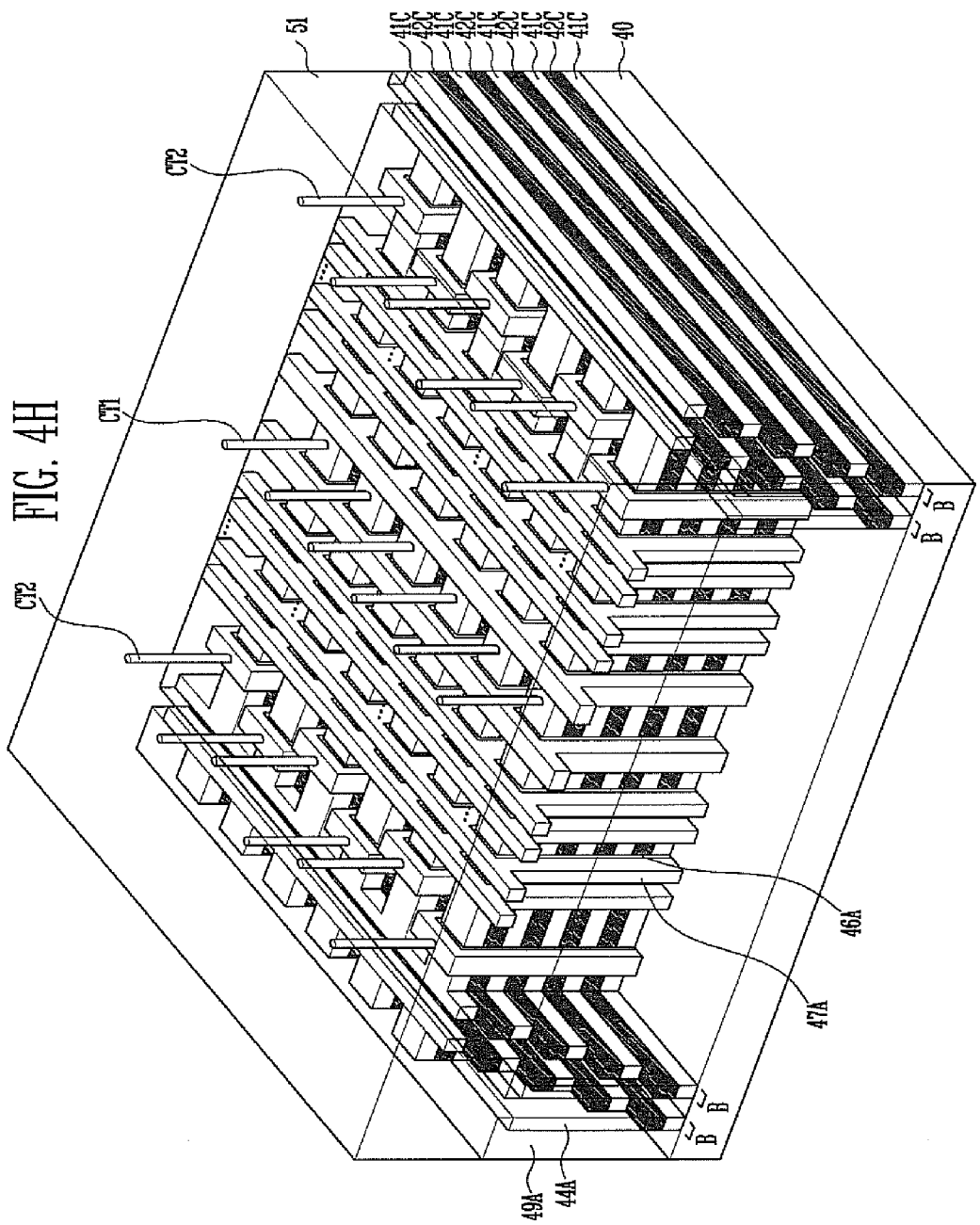

As shown in FIG. 4H, a third sacrificial layer 51 is formed on the entire structure including the plurality of source structures B. Here, the second sacrificial layer 51 is filled in regions etched in the process of forming the plurality of source structures B.

Drain contact holes coupled to the respective channel structures A are formed by etching the third sacrificial layer 51, the plurality of interlayer dielectric layers 41B, and the plurality of channel layers 42B. According to an example, the drain contact holes are formed to a depth that may expose all the channel layers 42B of one channel structure A. Furthermore, source contact holes exposing the respective source select lines SSL are formed by etching the third sacrificial layer 51.

In FIG. 4H, the interlayer dielectric layer etched in the process of forming the drain contact holes is newly labeled as 41C, and the semiconductor layer etched in the process is newly labeled as 42C.

Next, a second conductive layer is filled in the plurality of drain contact holes and the plurality of source contact holes to form a plurality of drain contact plugs CT1 and a plurality of source contact plugs CT2.

Figure 4I:
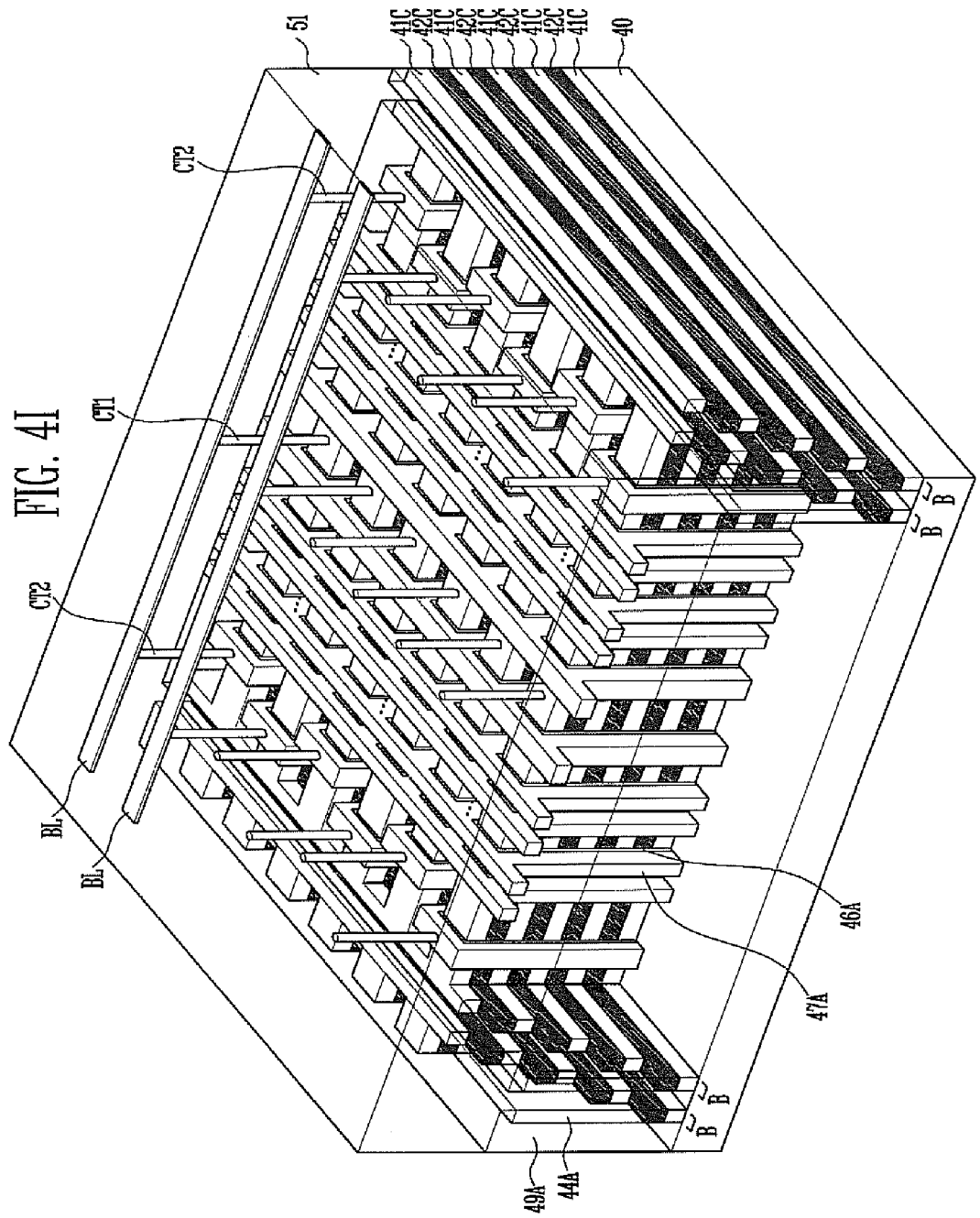

As shown in FIG. 4I, a plurality of bit lines BL extended in the first direction is formed. Each of the bit lines BL is coupled to the drain contact plug CT1 and the source contact plugs CT2 formed over one channel structure A. The bit line BL is formed over each of the channel structures A and is coupled to the plurality of channel layers 42B of the channel structure A through the drain contact plug CT1. In FIG. 4I, exemplary ones of the plurality of bit lines BL are shown for illustration purposes.

Figure 4J:
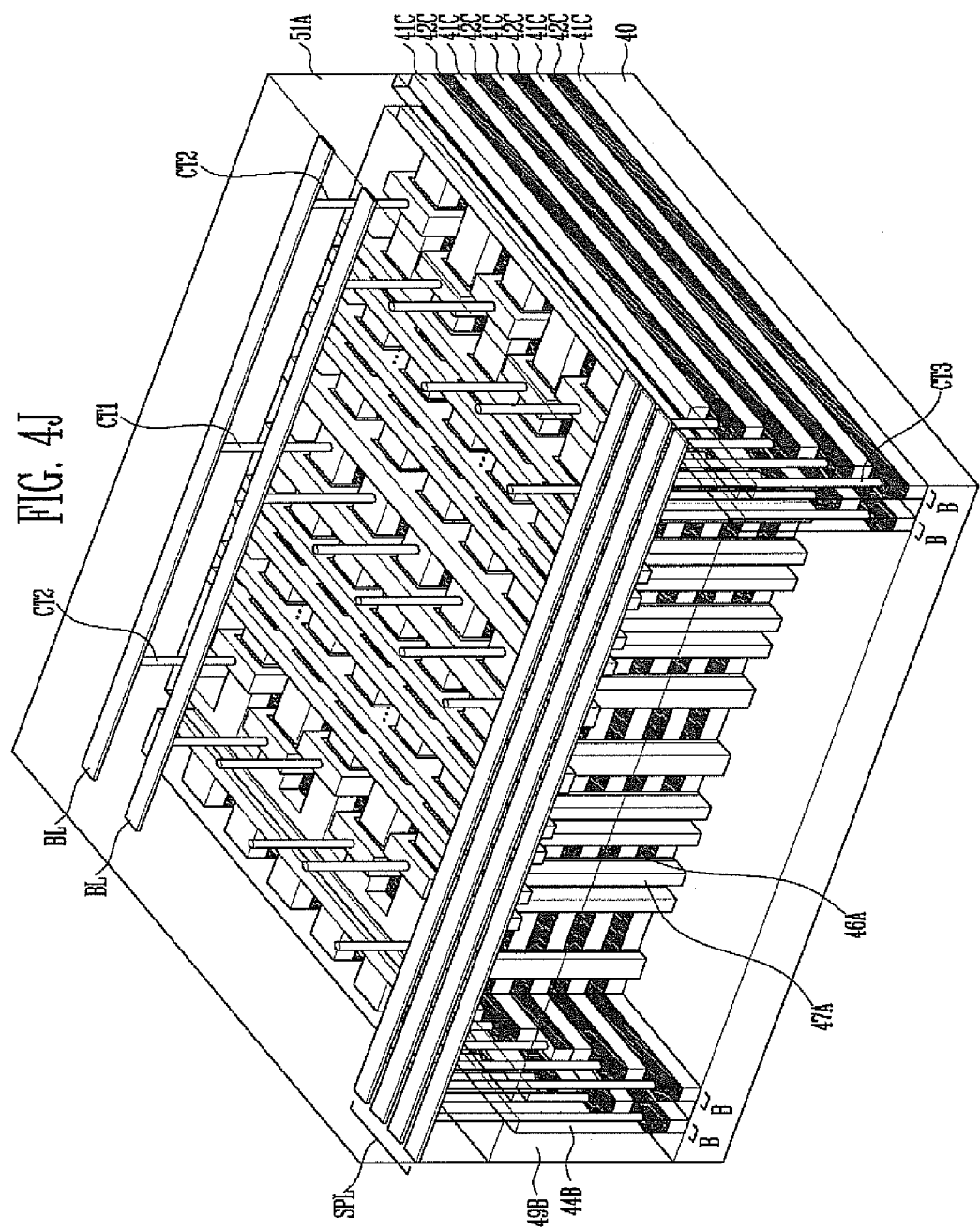

As shown in FIG. 4J, a plurality of pickup holes through which the pickup regions of the source structures B are exposed is formed by etching the third sacrificial layer 51, the second sacrificial layer 49A, and the first sacrificial layer 44A. A fourth conductive layer is filled in the plurality of pickup holes to form a plurality of source pickup plugs CT3. A plurality of source pickup lines SPL extended in the first direction I-I' is formed, and each of the source pickup lines SPL is coupled to the source pickup plugs CT3 formed in the same layer.

In FIG. 4J, the third sacrificial layer etched in the process of forming the pickup holes is newly labeled as 51A, the second sacrificial layer etched in the process is newly labeled as 49B, and the first sacrificial layer etched in the process is newly labeled as 44B.

The source pickup plugs CT3 may be formed simultaneously with the drain contact plugs CT1 and the source contact plugs CT2, and the source pickup lines SPL may also be formed simultaneously with the bit lines BL.

In the second embodiment, an example where, after the source blocks C are formed, the channel structures A are formed and the source blocks C are subsequently etched to form the source structures B has been described, but this disclosure is not limited thereto. For example, after the channel structures A are formed, the source blocks C may be formed and subsequently etched to form the source structures B. In some embodiments, after the channel structures A are formed, the source structures B may be formed or the channel structures A and the source structures B may be formed at the same time.

Figure 5:
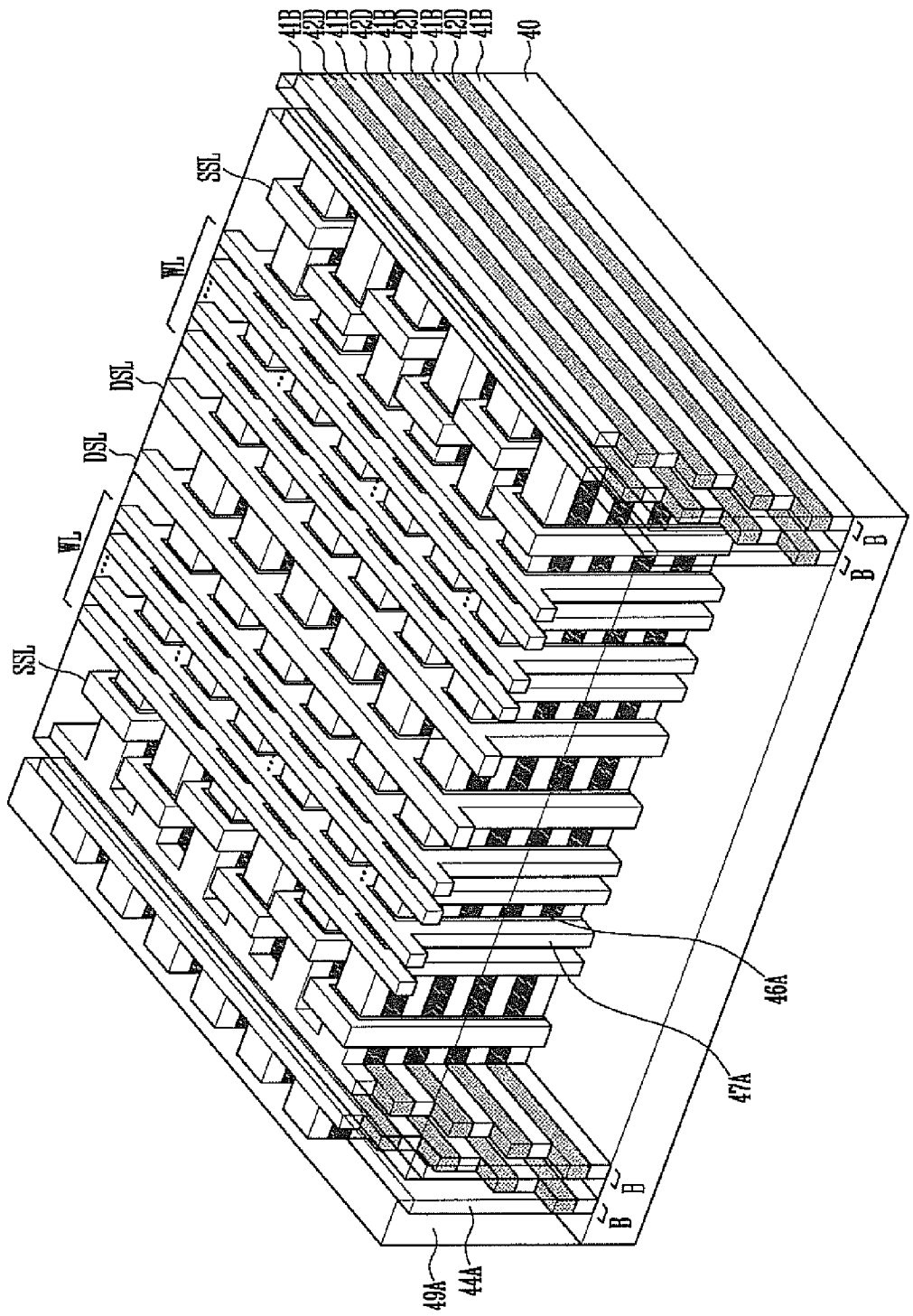
FIG. 5 is a perspective view of a 3-D structured non-volatile memory device according to a third embodiment of this disclosure.

FIG. 5 is a perspective view of a 3-D structured non-volatile memory device according to a third embodiment of this disclosure.

The memory device of the third embodiment has substantially the same structure as the memory device of the second embodiment except that the plurality of source lines 42D included in the source structures B is silicided.

The source lines 42D may be silicided by forming the source structures B by etching the source blocks C (refer to FIGS. 4A and 4G). In this case, the silicided source lines 42D may be formed by filling a metal layer in a gap region between the adjacent source structures B and making the metal layer and the source lines 42B react with each other through an annealing process. Here, some of the source lines 42B may be silicided.

The metal layer may be made of cobalt (Co), titanium (Ti), or nickel (Ni). The metal layer may react with the source lines 42B formed of a polysilicon layer, thus forming the source lines 42D including cobalt silicide, titanium silicide, or nickel silicide.

If the silicided source lines 42D are formed as described above, characteristics of the memory device can be improved because resistance of the source lines 42D is reduced.

Figure 6:
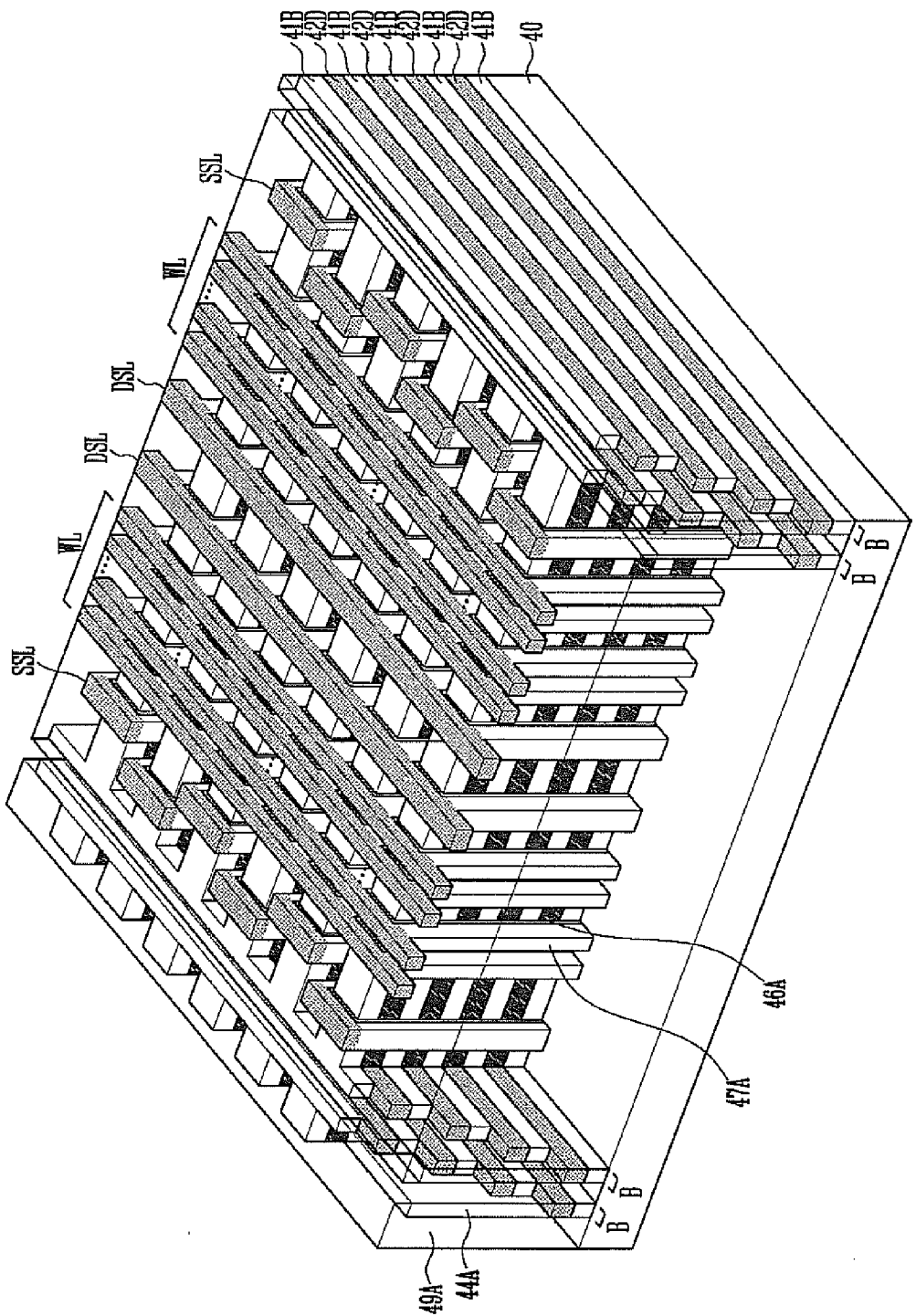
FIG. 6 is a perspective view of a 3-D structured non-volatile memory device according to a fourth embodiment of this disclosure.

FIG. 6 is a perspective view of a 3-D structured non-volatile memory device according to a fourth embodiment of this disclosure.

The memory device of the fourth embodiment has substantially the same structure as the memory device of the second embodiment, except that the plurality of source lines 42D included in the source structures B is silicided and upper parts of the word lines WL, the drain select lines DSL, and the source select lines SSL are silicided.

The source lines 42D, the word lines WL, the drain select lines DSL, and the source select lines SSL may be silicided by performing a polishing process so that the surface of the word lines WL, the drain select lines DSL, and the source select lines SSL is exposed and subsequently etching the source blocks C to form the source structures B by (refer to FIG. 4G).

In this case, a metal layer is formed on the entire structure so that a gap region between the adjacent source structures B is filled, and an annealing process is subsequently performed so that the metal layer reacts with the word lines WL, the drain select lines DSL, the source select lines SSL, and the source lines 42B. Consequently, the upper parts of the word lines WL, the drain select lines DSL, and the source select lines SSL are silicided and the source lines 42B are silicided.

The metal layer may be made of cobalt (Co), titanium (Ti), or nickel (Ni). The metal layer reacts with the source lines 42B formed of a polysilicon layer, thereby forming the word lines WL, the drain select lines DSL, the source select lines SSL, and the source lines 42D including cobalt silicide, titanium silicide, or nickel silicide.

According to exemplary embodiments of this disclosure, after the channel structures including the plurality of channel layers are formed, the tunnel insulating layer, the charge trap layer, and the charge block layer are formed and the channels are subsequently formed. As described above, the manufacturing process of this disclosure is performed so that deterioration of characteristics of the memory device due to a reduction in the film quality of the tunnel insulating layer can be prevented.

In particular, the source lines are individually included in the plurality of channel layers through the source structures and are picked up. Thus, a contact region for coupling bit lines is not necessary in each of the channel layers one of a channel structure. Furthermore, since the source select lines are formed in each channel structure, a plurality of strings included in the channel structure can be driven by one bit line. Here, the plurality of source select lines are formed in a staggered form over the channel structures. Accordingly, an increase of the area due to the plurality of source select lines formed in the channel structures can be prevented although the source select lines are formed in each of the channel structures.

What is claimed is:

1. A non-volatile memory device, comprising:
channel structures that each extend in a first direction, wherein the channel structures each include channel layers and interlayer dielectric layers that are alternately stacked;
a source structure extending in a second direction crossing the first direction and connected to ends of the channel structures, wherein the source structure includes source lines and interlayer dielectric layers that are alternately stacked; and
word lines extending in the second direction and formed to surround the channel structures.

2. The non-volatile memory device of claim 1, further comprising drain select line located on one side of the word lines, formed to surround the channel structures, and extending in the second direction.

3. The non-volatile memory device of claim 1, further comprising source select lines formed on the other side of the word lines, wherein the source select lines are formed in each of the channel structures.

4. The non-volatile memory device of claim 3, wherein the source select lines are arranged in a staggered form.

5. The non-volatile memory device of claim 1, wherein the source lines are coupled to channel layers, respectively, and the source lines are formed in the same layers as the respectively channel layers.

6. The non-volatile memory device of claim 1, wherein end of the source structure is patterned stepwise so that ends of the source lines included in the source structure are exposed.

7. The non-volatile memory device of claim 6, further comprising source pickup lines coupled to the source lines, respectively.

8. The non-volatile memory device of claim 1, further comprising:
drain contact plugs formed in each of the channel structures and coupled to the channel layers included in the channel structure;
source contact plugs coupled to the source select lines, respectively; and
bit lines coupled to the drain contact plugs and the source contact plugs of each of the channel structures and extending in the first direction.

9. The non-volatile memory device of claim 1, wherein upper parts of the word lines are silicided.

10. The non-volatile memory device of claim 1, wherein the source lines of the source structure are silicided.

11. A non-volatile memory device, comprising:
channel structures each formed to include channel layers and interlayer dielectric layers which are alternately stacked;
source lines coupled to the respective channel layers included in the channel structures; and
bit lines coupled to the channel layers included in each of the channel structures,
wherein the channel layers included in one channel structure are coupled to different source lines, respectively.

12. A non-volatile memory device, comprising:
channel structures extending in a first direction, wherein the channel structures each include channel layers and interlayer dielectric layers that are alternately stacked;
a source structure extending in a second direction crossing the first direction, connected to ends of the channel structures, and including source lines and interlayer dielectric layers that are alternately stacked;
word lines extending in the second direction and formed to surround the channel structures;
a drain select line formed on one side of the word lines, formed to surround the channel structures, and extending in the second direction;
source select lines formed on the other side of the word lines, wherein the source select lines are formed in the channel structures, respectively; and
bit lines extending in the first direction and coupled to the channel layers and source select lines of the channel structures,
wherein ends of the respective source lines included in the source structure are patterned stepwise.

13. The non-volatile memory device of claim 12, wherein in a read operation, a read voltage is applied to the word lines and an operating voltage is applied to the drain select line, an operating voltage is applied to the bit lines and the source select line of a selected one of the channel structures, wherein the source line of a selected string is grounded and the operating voltage is applied to the source lines of unselected strings, and the bit lines and the source select lines coupled to an unselected one of the channel structures are grounded.

14. The non-volatile memory device of claim 12, wherein in a program operation, the drain select line is grounded, a program voltage is applied to a selected one of the word lines, and a pass voltage is applied to unselected ones of the word lines, an operating voltage is applied to the bit lines and the source select line coupled to a selected channel structures, wherein the source line of a selected string is grounded and the operating voltage is applied to the source lines of unselected strings, and the bit lines and the source select lines coupled to an unselected one of the channel structures are grounded.

15. The non-volatile memory device of claim 12, wherein in an erase operation, the bit lines, the drain select line, and the source select lines of a selected memory block are in floating states, the word lines of the selected memory block are grounded, and an erase voltage is applied to the source lines.

* * * * *